(12) United States Patent
Sasaki

(10) Patent No.: US 8,269,296 B2
(45) Date of Patent: Sep. 18, 2012

(54) CAMERA MODULE AND METHOD OF PRODUCING THE SAME

(75) Inventor: Hironori Sasaki, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 180 days.

(21) Appl. No.: 12/544,400

(22) Filed: Aug. 20, 2009

(65) Prior Publication Data

US 2010/0053318 A1 Mar. 4, 2010

(30) Foreign Application Priority Data

Aug. 28, 2008 (JP) ................................. 2008-219647

(51) Int. Cl.
*H01L 31/0232* (2006.01)

(52) U.S. Cl. ................ 257/432; 257/E31.127; 348/125; 438/65

(58) Field of Classification Search .................. 257/432, 257/E31.127

See application file for complete search history.

(56) References Cited

U.S. PATENT DOCUMENTS

2009/0014762 A1* 1/2009 Matsuo et al. ................ 257/292
2009/0122178 A1* 5/2009 Kwon et al. .................. 348/340

FOREIGN PATENT DOCUMENTS

JP 2004-063751 A 2/2004

* cited by examiner

*Primary Examiner* — Mamadou Diallo
(74) *Attorney, Agent, or Firm* — Kubotera & Associates, LLC

(57) ABSTRACT

A camera module includes a sensor chip having a backside surface and a main surface including a sensor forming region and a sensor peripheral region surrounding the sensor forming region, in which a light receiving portion is disposed in the sensor forming region; a lens chip having a non-lens forming surface and a lens forming surface including a lens forming region and a lens peripheral region surrounding the lens forming region, in which a lens portion disposed in the lens forming region; a spacer portion for bonding the sensor peripheral region to the lens peripheral region with a specific space in between so that the light receiving portion faces the lens portion; and a cover including an opening portion for passing light from outside toward the lens portion and the light receiving portion.

11 Claims, 17 Drawing Sheets

CAMERA MODULE AND METHOD OF PRODUCING THE SAME

BACKGROUND OF THE INVENTION AND RELATED ART STATEMENT

The present invention relates to a camera module. More specifically, the present invention relates to a camera module having a lens chip and a spacer portion for bonding the lens chip. The present invention also relates to a method of producing the camera module.

Recently, a demand for a small camera module has been increasing in an application such as a mobile phone camera module and a security monitoring camera module. Among components constituting the camera module, an image element for converting an image to an electrical signal tends to be a most expensive component. The image element is generally formed of a CMOS (Complementary Metal Oxide Semiconductor) image sensor.

The CMOS image sensor can be manufactured through an ordinary semiconductor manufacturing process. Accordingly, when a size of the CMOS image sensor decreases, it is possible to drastically reduce a cost of the CMOS image sensor. For this reason, a total size of the camera module and a size of an optical lens disposed in the camera module have been decreasing rapidly. Patent Reference has disclosed a technology for further reducing a cost of the camera module, in which the camera module is assembled in a wafer level, thereby producing the camera module of a chip size package (CSP) type.

Patent Reference: Japanese Patent Publication No. 2004-063751

According to the technology disclosed in Patent Reference, first, a glass substrate and a semiconductor substrate are prepared. The glass substrate is provided with a plurality of lenses integrally formed thereon. The semiconductor substrate is provided with a plurality of sensors integrally formed thereon. Then, the glass substrate is positioned and aligned with the semiconductor substrate in a wafer level, so that each of the lenses is aligned with each of the sensors, thereby collectively aligning optical axes thereof. After the glass substrate is bonded to the semiconductor substrate, the glass substrate and the semiconductor substrate thus bonded are diced (individually separated), thereby obtaining the camera module.

When it is required to reduce a thickness of a mobile phone, it is necessary to reduce a size or a height of the camera module to be mounted thereon accordingly. As a result, it is necessary to reduce a thickness of the semiconductor substrate or the sensor wafer.

In general, when it is necessary to reduce a thickness of the sensor wafer, a back-grind method is adopted. In the back-grind method, a wafer holding surface as one side surface of the sensor wafer is held in a wafer holder, and a wafer grinding surface as the other side surface of the sensor wafer is pressed against a polisher stage plate, so that the sensor wafer is ground while a polishing agent is being dropped. When the sensor wafer is ground using the polishing agent, an alkali type cleaning liquid is used for removing the polishing agent.

In order to reduce a thickness of the sensor wafer, there are generally two steps, i.e., a grinding process in which a backside surface of the sensor wafer is ground with a grind stone, and a CMP (chemical Mechanical Polishing) process in which the backside surface is further polished to obtain a mirror surface.

When the backside surface of the sensor wafer is ground with the grind stone, it is necessary to grind the backside surface uniformly. Accordingly, in order to improve a manufacture yield of a semiconductor chip after the sensor wafer is diced, it is imperative to securely hold the sensor wafer with the wafer holder. Further, when a ground dust or a polishing agent contacts with the wafer holding surface with an electric circuit such as a sensor formed thereon, the sensor wafer may be damaged. Accordingly, it is necessary to securely protect the wafer holding surface during the grinding process. Still further, when the sensor wafer is ground, the sensor wafer tends to warp. Accordingly, it is necessary to correct the warpage of the sensor wafer during the grinding process.

To this end, when the backside surface of the sensor wafer is ground with the grind stone, a back-grind adhesive sheet and a jig formed of stainless steel called a guide ring are used. The guide ring has an opening at a center portion thereof having a diameter greater than that of the sensor wafer. The guide ring is attached to the adhesive sheet, and the sensor wafer is attached to the adhesive sheet at the opening. In this step, the wafer holding surface with the sensor formed thereon is attached to the adhesive sheet, thereby fixing the sensor wafer and protecting a foreign matter from attaching to the wafer holding surface. Accordingly, it is possible to securely protect the sensor wafer during the grinding process.

When the sensor wafer is attached to the adhesive sheet with a small adhesion strength, the sensor wafer may move or be peeled off from the adhesive sheet due to the warpage thereof. On the other hand, when the sensor wafer is attached to the adhesive sheet with an excessive adhesion strength, it is difficult to remove the sensor wafer from the adhesive sheet or damage the wafer upon removing from the adhesive sheet after the grinding process. Accordingly, it is necessary to attach the sensor wafer to the adhesive sheet with an optimal adhesion strength.

After the sensor wafer is attached to the adhesive sheet, the guide ring is installed in a grinding device. In the grinding device, the guide ring rotates together with the grinding stage while the sensor wafer is pressed against the grinding stage with an appropriate force, thereby grinding the backside surface of the sensor wafer. In the grinding process, the sensor wafer is attached to the adhesive sheet with an appropriate adhesion force to prevent the warpage thereof. Accordingly, it is possible to prevent the sensor wafer from warping even when the thickness of the sensor wafer decreases.

After the sensor wafer is ground to have a specific target thickness, the backside surface of the sensor wafer is polished to obtain the mirror surface. In the polishing process, a polishing cloth and a polishing liquid are used. More specifically, the guide ring rotates together with the polishing cloth while the sensor wafer is pressed against the polishing cloth with an appropriate force, thereby polishing the backside surface of the sensor wafer.

Patent Reference does not disclose a method of grinding a backside surface of the semiconductor wafer in detail. In the manufacturing process of the CSP camera module, the wafer holding surface of the sensor wafer (the surface with the sensor formed thereon) is generally covered with a cover glass before the grinding process, thereby preventing the sensor from being contaminated or damaged during the grinding process or the dicing process of the sensor wafer.

In Patent Reference, the glass substrate as a transparent substrate is provided with a convex lens on an outer side thereof. The glass substrate as the cover glass covers the semiconductor wafer with the sensor, and the backside surface of the semiconductor wafer is ground. In this case, only a convex portion of the convex lens is attached to the adhesive sheet. Accordingly, it is difficult to attach the glass substrate to the adhesive sheet with a sufficient adhesion strength, thereby causing unstable adhesion in the grinding process.

In view of the problems described above, an object of the present invention is to provide a camera module and a method of producing the camera module capable of solving the problems of the conventional technology. In the present invention, it is possible to reduce the number of manufacturing steps and improve a manufacturing yield.

Further objects and advantages of the invention will be apparent from the following description of the invention.

SUMMARY OF THE INVENTION

In order to attain the objects described above, according to a first aspect of the present invention, a method of producing a camera module includes the step of: preparing a semiconductor wafer having a main surface and a backside surface opposite to the main surface. The main surface includes a sensor forming region and a sensor peripheral region surrounding the sensor forming region. A light receiving portion of an optical-electric conversion element is disposed in the sensor forming region.

The method of producing the camera module further includes the step of preparing a lens wafer having a lens forming surface and a non-lens forming surface as a flat surface opposite to the lens forming surface. The lens forming surface includes a lens forming region and a lens peripheral region surrounding the lens forming region. A lens portion is disposed in the lens forming region. The lens wafer is formed of at least one transparent optical wafer.

The method of producing the camera module further includes the steps of bonding the sensor peripheral region to the lens peripheral region through a spacer portion with a specific space in between so that the light receiving portion faces the lens portion to obtain a bonded member formed of the semiconductor wafer and the lens wafer; polishing the backside surface of the semiconductor wafer while the bonded member is held through the non-lens forming surface; and cutting the bonded member in pieces along the sensor peripheral region and the lens peripheral region to obtain the camera module formed of a sensor chip bonded to a lens chip through the spacer portion.

In the first aspect of the present invention, when the backside surface of the semiconductor wafer bonded to the lens wafer is polished, the lens portion does not receive an external force. Further, a through electrode is formed in the semiconductor wafer, the lens portion does not deform or is not deteriorated due to an etching material.

According to a second aspect of the present invention, a camera module includes a sensor chip having a main surface and a backside surface opposite to the main surface. The main surface includes a sensor forming region and a sensor peripheral region surrounding the sensor forming region. A light receiving portion of an optical-electric conversion element is disposed in the sensor forming region.

The camera module further includes a lens chip having a lens forming surface and a non-lens forming surface as a flat surface opposite to the lens forming surface. The lens forming surface includes a lens forming region and a lens peripheral region surrounding the lens forming region. A lens portion is formed in the lens forming region. The lens chip is formed of at least one transparent optical wafer.

The camera module further includes a spacer portion for bonding the sensor peripheral region to the lens peripheral region with a specific space in between so that the light receiving portion faces the lens portion. The sensor chip, the lens chip, and the spacer portion have a common outer flat side surface.

The camera module further includes a cover for covering the non-lens forming surface and the outer flat side surface. The cover includes an opening portion for passing light from outside toward the lens portion and the light receiving portion.

DETAILED DESCRIPTION OF PREFERRED EMBODIMENTS

Figure 1:
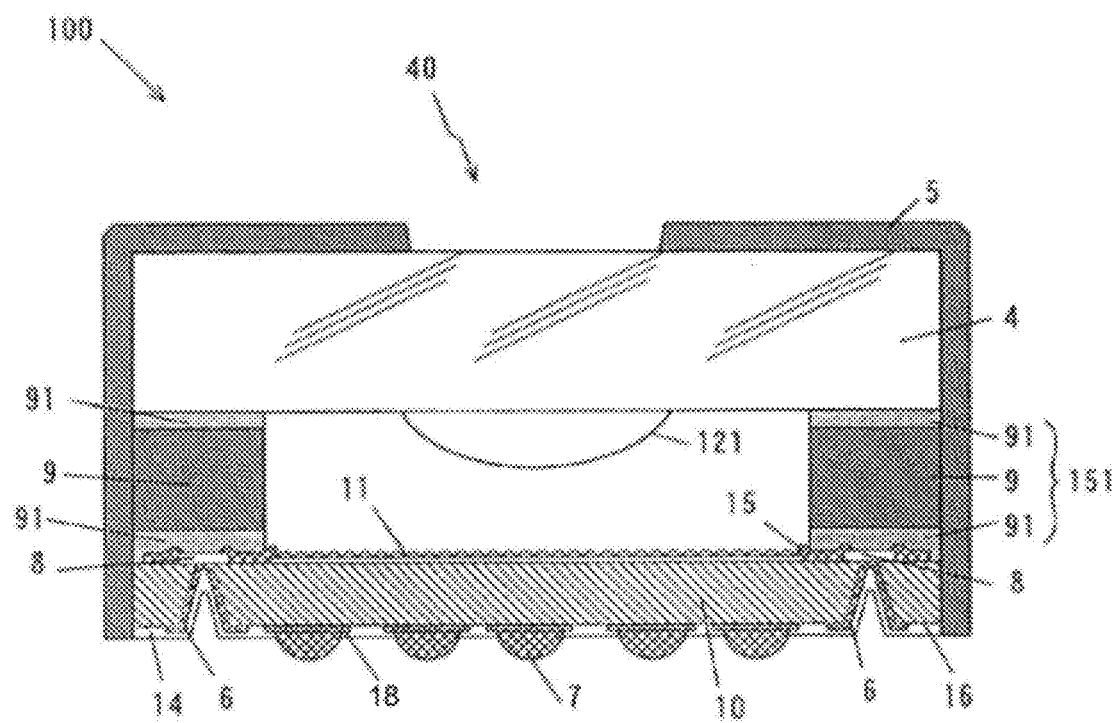
FIG. 1 is a schematic sectional view showing a camera module according to a first embodiment of the present invention.

Hereunder, preferred embodiments of the present invention will be explained with reference to the accompanying drawings. In the accompanying drawings, similar components are designated with the same reference numerals, and redundant explanations thereof are omitted. The embodiments merely represent examples, and the present invention is not limited to the embodiments.

First Embodiment

A first embodiment of the present invention will be explained. FIG. 1 is a schematic sectional view showing a camera module 100 according to the first embodiment of the present invention. As shown in FIG. 1, the camera module 100 includes a sensor chip 10 bonded to a lens chip 40 with a spacer portion 151 in between.

In the embodiment, the sensor chip 10 is formed of a silicon substrate having a first main surface with a light receiving portion 11 of an optical-electrical conversion element formed thereon and a backside surface opposite to the first main surface. The lens chip 40 has a lens forming surface with a lens portion 121 formed thereon and a non-lens forming surface as a flat surface opposite to the lens forming surface.

In the embodiment, the spacer portion 151 is provided for bonding the sensor chip 10 to the lens chip 40, so that the light receiving portion 11 faces the lens portion 121 with a specific distance in between. The lens chip 40 includes a flat glass plate 4 and the lens portion 121 formed on an inner surface of the flat glass plate 4. Note that the lens chip 40 is individually cut from a glass wafer or a transparent optical wafer (the flat glass plate 4) together with the sensor chip 10.

In the embodiment, the lens portion 121 is formed of a transparent resin of an ultraviolet light setting type or a thermosetting type. Note that the lens portion 121 is formed only on the inner surface of the flat glass plate 4. The spacer portion 151 is formed of a spacer 9 having a specific thickness for defining a flange back and adhesive layers 91 disposed on both surfaces of the spacer 9. The adhesive layers 91 are formed of an adhesive of an ultraviolet light setting type or a thermosetting type.

In the embodiment, the light receiving portion 11 is formed on the first main surface of the sensor chip 10 in a sensor forming region, and includes a light receiving element such as a CMOS (Complementary Metal Oxide Semiconductor) image sensor. An on-chip micro-lens may be disposed to mount on each of the light receiving element. Inner wiring portions 15 and metal pads 8 are disposed in a sensor peripheral region of the sensor chip 10 surrounding the light receiving portion 11, and are connected to the light receiving portion 11.

In the embodiment, outer wiring portions 18 and outer terminals 7 are disposed on the backside surface (a second main surface) of the sensor chip 10 opposite to the first main surface thereof. Further, an insulating film 14 is formed on the backside surface of the sensor chip 10 except the outer terminals 7.

In the embodiment, the sensor chip 10 is provided with through electrodes 6 below the metal pads 8 formed near an outer circumference of the first main surface thereof, so that the through electrodes 6 electrically connect the inner wiring portions 15 and the outer wiring portions 18. With the through electrodes 6 penetrating through the first main surface and the second main surface, it is possible to establish an electrical connection to the light receiving portion 11 through the outer wiring portions 18 disposed on the backside surface of the sensor chip 10 without providing a conductive member in a side surface of the sensor chip 10. An insulating film 16 covers an entire area of the backside surface of the sensor chip 10 and inner surfaces of through holes 61 (refer to FIG. 13). Accordingly, the insulating film 16 electrically insulates the through electrodes 6 from the sensor chip 10.

As described above, the lens chip 40 has the lens forming surface and the non-lens forming surface as the flat surface facing the lens forming surface. Further, the lens forming surface has a lens forming region with the lens portion 121 formed therein and a lens peripheral region surrounding the lens forming region.

In the embodiment, the lens chip 40 is bonded to the first main surface of the sensor chip 10 with the spacer portion 151 disposed in the sensor peripheral region at a periphery of the light receiving portion 11 in between, so that the lens chip 40 is away from the light receiving portion 11 with a specific space in between. Then, the lens chip 40 is individually cut from the glass wafer together with the sensor chip 10 through a dicing process. Accordingly, the lens chip 40, the sensor chip 10, and the spacer portion 151 share a common side surface as an outer flat surface.

In the embodiment, a cover 5 formed of a black light blocking resin is disposed on an entire area of the side surface and a periphery portion of the non-lens forming surface of the lens chip 40. The cover 5 includes an opening portion for passing light toward the lens portion 121 and the light receiving portion 11 from outside and for preventing light from entering through the side surface. With the configuration described above, the camera module 100 is obtained. The cover 5 exposes the flat surface opposite to the lens portion 121, and covers the outer flat surface or the side surface of the lens chip 40, the sensor chip 10, and the spacer portion 151, thereby conserving an amount of a cover material.

A method of producing the camera module 100 will be explained next with reference to FIGS. 2 to 18.

Semiconductor Wafer Producing Process

Figure 2:
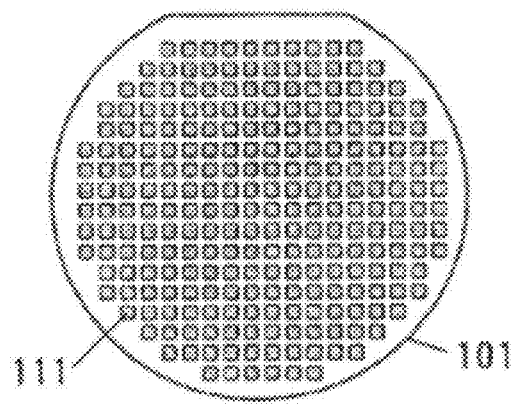
FIG. 2 is a schematic plan view showing a semiconductor wafer of the camera module according to the first embodiment of the present invention.

FIG. 2 is a schematic plan view showing a semiconductor wafer 101 of the camera module 100 according to the first embodiment of the present invention. As shown in FIG. 2, a plurality of sensor forming regions 111 is formed on a surface of the semiconductor wafer 101 having a diameter of 6 inches or 8 inches (a thickness of 625 μm to 725 μm) in a matrix pattern or an array pattern through a semiconductor manufacturing process.

Figure 3:
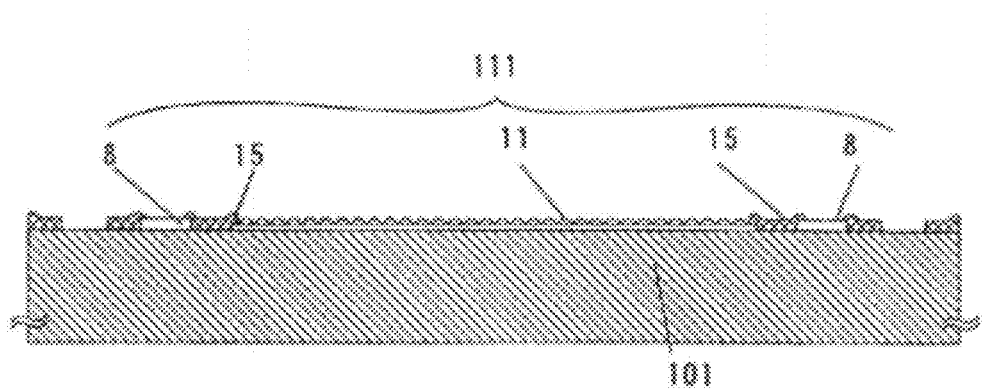
FIG. 3 is a partially enlarged schematic sectional view showing the semiconductor wafer of the camera module in a semiconductor wafer producing process according to the first embodiment of the present invention.

FIG. 3 is a partially enlarged schematic sectional view showing the semiconductor wafer 101 of the camera module 100 in a semiconductor wafer producing process according to the first embodiment of the present invention. As shown in FIG. 3, in each of the sensor forming regions 111, the light receiving portion 11 of the optical-electrical conversion element and the metal pads 8 in the periphery thereof are formed on the first main surface of the semiconductor wafer 101. The CMOS image sensor formed of a plurality of pixels arranged in a matrix pattern (for example, 30 million pixels) is formed in the light receiving portion 11. The micro-lens may be disposed corresponding to each of the light receiving elements of the light receiving portion 11. In each of the pixels, an amplifier formed of several CMOS transistors corresponding to each of the light receiving elements is disposed. The metal pads 8 are formed of a metal having good conductivity such as aluminum (Al).

In the next step, the inner wiring portions 15 are formed, so that the light receiving portion 11 including the light receiving elements is connected to the metal pads 8 in the periphery thereof. Accordingly, a plurality of the sensor forming regions 111 is formed on the first main surface of the semiconductor wafer 101 in the matrix pattern or the array pattern with a space in a lattice pattern in between. The space becomes a dicing region in a dicing process (described later).

Glass Wafer Producing Process

Figure 4:
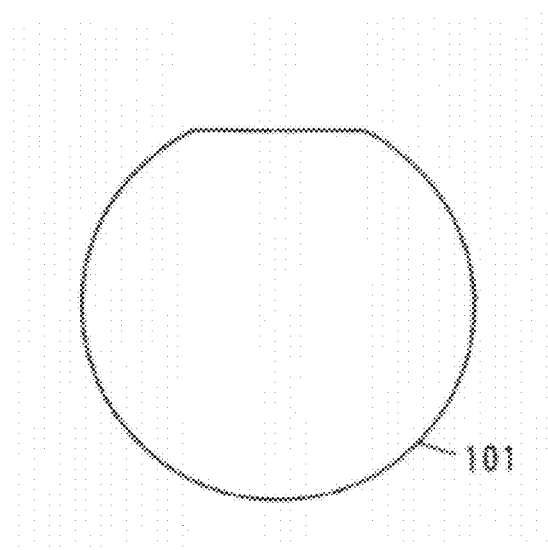
FIG. 4 is a schematic sectional view showing a glass wafer of the camera module according to the first embodiment of the present invention.

In the next step, the glass wafer (the flat glass plate 4) having a diameter the same as that of the semiconductor wafer 101, i.e., 6 inches or 8 inches, and a thickness of 625 μm to 725 μm is prepared. FIG. 4 is a schematic sectional view showing the glass wafer 4 of the camera module 100 according to the first embodiment of the present invention.

In a glass wafer producing process, a plurality of the lens portions 121 is formed on the glass wafer 4 in an array pattern matching to the array pattern or the matrix pattern of the sensor forming regions 111 of the semiconductor wafer 101, thereby forming the transparent optical wafer or the glass wafer.

Figure 5:
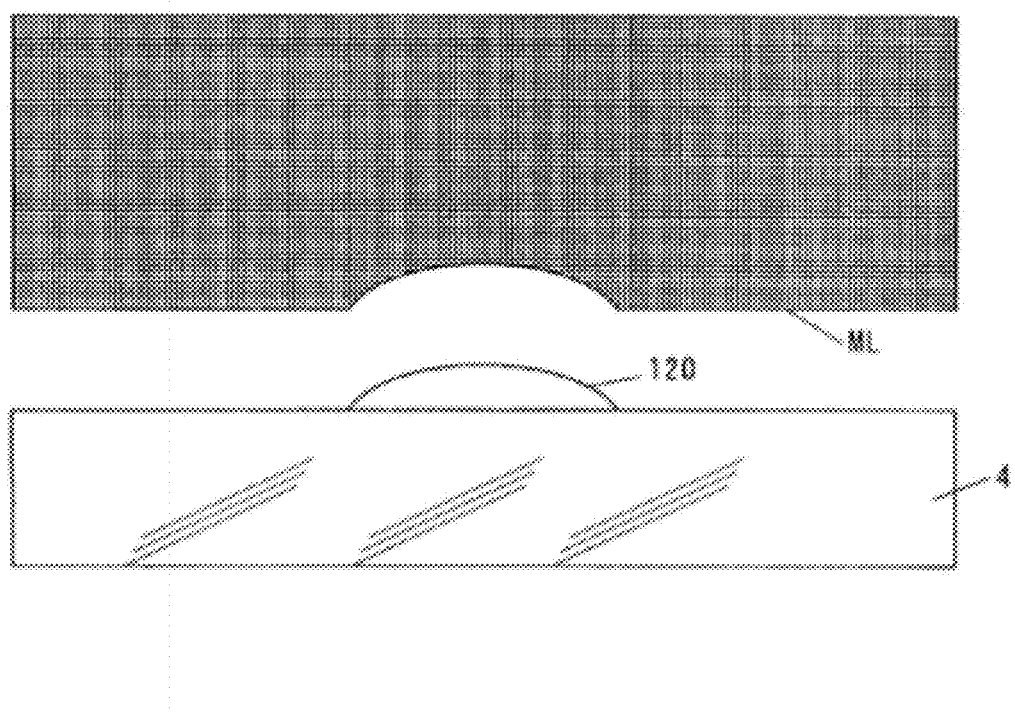
FIG. 5 is an enlarged schematic sectional view No. 1 showing the glass wafer of the camera module and a first mold die in a glass wafer producing process according to the first embodiment of the present invention.

FIG. 5 is an enlarged schematic sectional view No. 1 showing the glass wafer 4 of the camera module 100 and a first mold die ML in the glass wafer producing process according to the first embodiment of the present invention.

In the next step, a first lens transparent resin is applied to the backside surface of the glass wafer 4. Then, as shown in FIG. 5, the first lens transparent resin is pressed into a recess portion of the first mold die ML, thereby forming a base lens portion 120.

Figure 6:
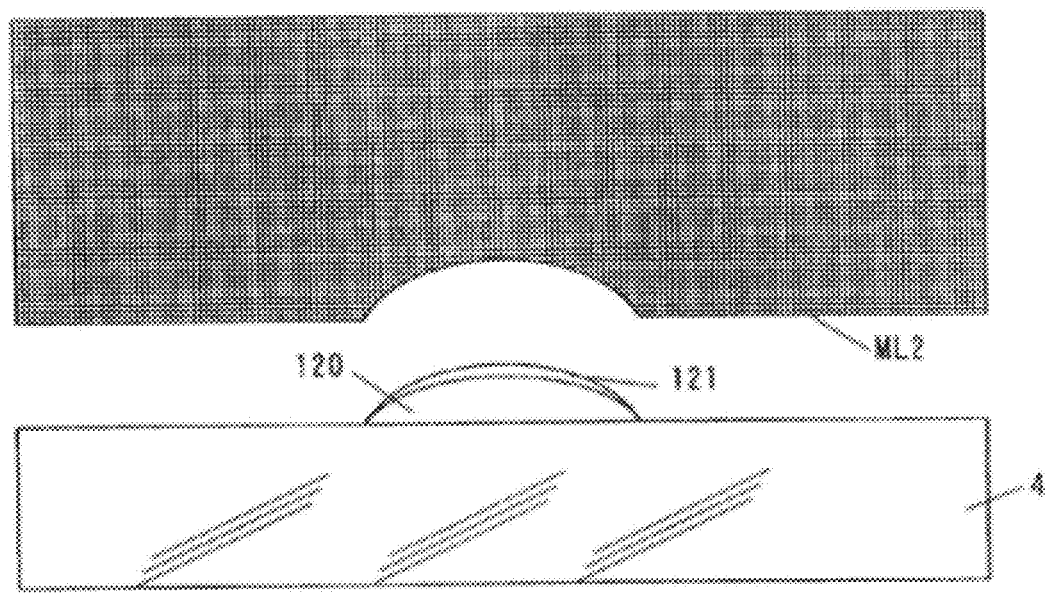
FIG. 6 is an enlarged schematic sectional view No. 2 showing the glass wafer of the camera module and a second mold die in the glass wafer producing process according to the first embodiment of the present invention.

FIG. 6 is an enlarged schematic sectional view No. 2 showing the glass wafer 4 of the camera module 100 and a second mold die ML2 in the glass wafer producing process according to the first embodiment of the present invention.

In the next step, a second lens transparent resin is applied to the base lens portion 120 of the glass wafer 4. Then, as shown in FIG. 6, the second lens transparent resin is pressed into a recess portion of the second mold die ML2, thereby forming the lens portion 121.

As described above, in the embodiment, the first lens transparent resin and the second lens transparent resin are molded with the first mold die ML and the second mold die ML2, respectively. In this case, the first lens transparent resin and the second lens transparent resin are overlapped at a same position, and are hardened with a thermal process or a UV irradiation process. Accordingly, it is possible to form the lens portion 121 having great power. The first lens transparent resin and the second lens transparent resin may be a thermosetting type or an ultraviolet light setting type.

In the embodiment, the glass wafer 4 may be formed using one single mold die and one single resin through one molding process. Alternatively, the glass wafer 4 may be formed using three types of mold dies and three types of resins applied to a same position through more than three molding processes. In this case, it is possible to form the lens portion 121 having further greater power.

Figure 7:
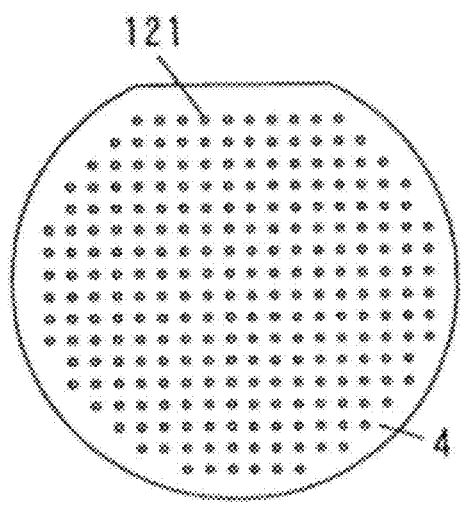
FIG. 7 is a schematic plan view showing the glass wafer of the camera module viewed from a lens portion thereof according to the first embodiment of the present invention.

FIG. 7 is a schematic plan view showing the glass wafer 4 of the camera module 100 viewed from the lens portion 121 thereof according to the first embodiment of the present invention.

In the embodiment, the glass wafer 4 has the flat surface on the main surface opposite to the lens portion 121. The first mold die ML and the second mold die ML2 may be ones used in a nano-inprint technology. When the lens portion 121 has the two layered structure, it is preferred that the first layer on the side of the glass wafer 4 is formed of a flexible resin with low shrinkage such as poly-dimethyl siloxane, and the second layer is formed of a resin having a hardness greater than that of the first layer such as an epoxy resin. Accordingly, it is possible to improve heat resistance during a reflow process.

When the lens portion 121 has the multi-layered structure, it is possible to cancel out a difference in thermal expansion coefficients of the resins or prevent excessive deformation after ultraviolet setting or thermal setting, thereby making it possible to select wide variety of resins.

In the embodiment, the lens portion 121 may be formed individually. It is preferred to collectively form a plurality of the lens portions 121 on the substrate through the method described above. In this case, the glass wafer 4 is formed of the glass portion and the resin portion, i.e., a hybrid lens. In the hybrid lens, it is possible to use a resin capable of withstanding the reflow process, and to minimize an inherent variance in a shape of the resin after the resin is hardened.

Spacer Portion Producing Process

Figure 8:
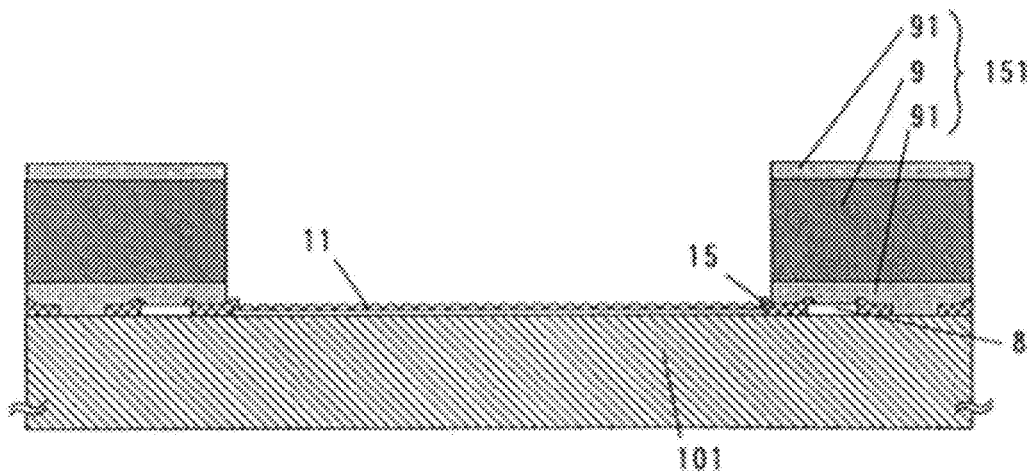
FIG. 8 is an enlarged schematic sectional view No. 1 showing the semiconductor wafer of the camera module in a spacer portion producing process according to the first embodiment of the present invention.

FIG. 8 is an enlarged schematic sectional view No. 1 showing the semiconductor wafer 101 of the camera module 100 in a spacer portion producing process according to the first embodiment of the present invention.

In the next step, as shown in FIG. 8, the spacer portion 151 is bonded to the semiconductor wafer 101 with an adhesive, so that a focal point of the lens portion 121 is fixed to the light receiving portion 11 of the semiconductor wafer 101 in the sensor forming region. More specifically, the spacer portion 151 is bonded to the semiconductor wafer 101 at a position surrounding the light receiving portion 11 on the first main surface of the semiconductor wafer 101 in the sensor forming region as the dicing region.

As shown in FIG. 8, the spacer portion 151 is formed of the spacer 9 having a specific thickness for defining the flange back and the adhesive layers 91 disposed on both surfaces of the spacer 9. The adhesive layers 91 are formed of a photosensitive polymeric material with heat resistance such as benzocyclobutene (BCB) and a polyimide, and may be an ultraviolet light setting type or a thermosetting type.

Figure 9:
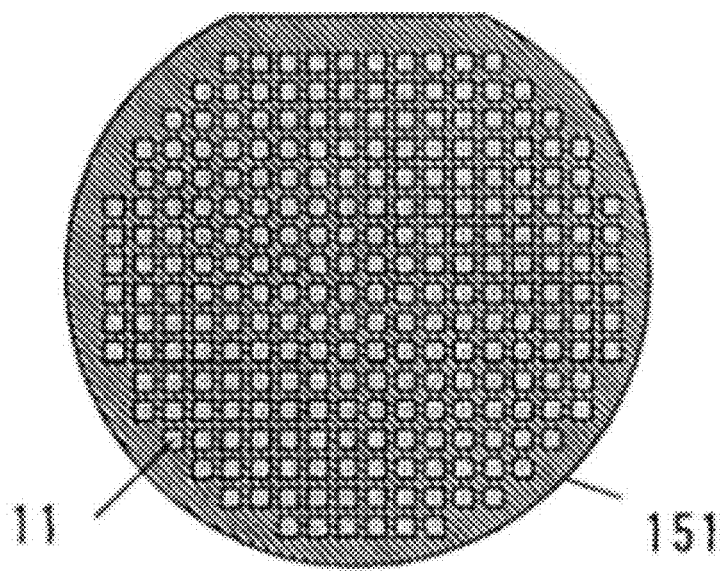
FIG. 9 is an enlarged schematic sectional view No. 2 showing the semiconductor wafer of the camera module in the spacer portion producing process according to the first embodiment of the present invention.

FIG. 9 is an enlarged schematic sectional view No. 2 showing the semiconductor wafer 101 of the camera module 100 in the spacer portion producing process according to the first embodiment of the present invention.

As shown in FIG. 9, when the spacer portion 151 is bonded to the semiconductor wafer 101, the spacer portion 151 having the lattice pattern situated in the dicing region on the semiconductor wafer 101 surrounds each of the light receiving portions 11. Note that each of the light receiving portions 11 corresponds to each of the lens portions 121 of the glass wafer 4.

Bonding Process

Figure 10:
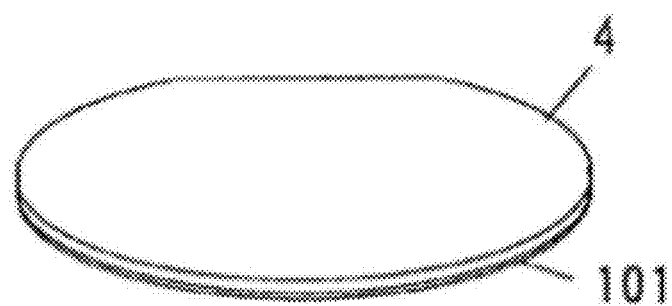
FIG. 10 is a schematic perspective view showing a bonded member formed of the glass wafer and the semiconductor wafer of the camera module in a bonding process according to the first embodiment of the present invention.

FIG. 10 is a schematic perspective view showing a bonded member formed of the glass wafer 4 and the semiconductor wafer 101 of the camera module 100 in a bonding process according to the first embodiment of the present invention.

In the next step, the lens portion 121 are positioned to face the sensor forming regions 111 such that the lens portion 121 are situated only inside, and the semiconductor wafer 101 is bonded and fixed to the glass wafer 4 or the transparent optical wafer. In this step, the glass wafer 4 and the semiconductor wafer 101 are positioned such that the light receiving portions 11 on the semiconductor wafer 101 are surrounded with the spacer portion 151 formed on the backside surface of the glass wafer 4 in the lattice pattern.

In the embodiment, when the adhesive layers 91 are formed of a photosensitive adhesive, light is irradiated from a side of the glass wafer 4, so that the spacer portion 151 is hardened with light, thereby bonding the glass wafer 4 to the semiconductor wafer 101. The spacer 151 has a function of bonding the glass wafer 4 to the semiconductor wafer 101 with a specific distance therebetween, and further has a function of sealing each of the sensor forming regions 111 in a grinding process, an electrode forming process, and a dicing process (described later).

In the embodiment, the bonded member formed of the glass wafer 4 and the semiconductor wafer 101 is produced through the bonding process described above, and has a structure in which the glass wafer 4 having a large thickness is bonded to the semiconductor wafer 101 having a small thickness. Accordingly, it is possible to eliminate a cover glass or a protection glass for reinforcing a conventional semiconductor wafer, thereby reducing a height of the camera module 100.

In the embodiment, the lens portion 121 is not formed on the upper surface of the glass wafer 4 or the transparent optical wafer. Accordingly, when the glass wafer 4 is attached to a substrate holding device of a grinding device in the grinding process, the surface of the glass wafer 4 with the lens portion 121 formed thereon does not contact with the substrate holding device. Accordingly, it is possible to prevent the glass wafer 4 from warping. Further, the lens portion 121 is formed of the resin, and is covered with the semiconductor wafer 101, the glass wafer 4, and the spacer portion 151. Accordingly, it is possible to prevent the lens portion 121 from deteriorating due to a high temperature and a chemical substance in the electrode forming process.

Grinding Process

Figure 11:
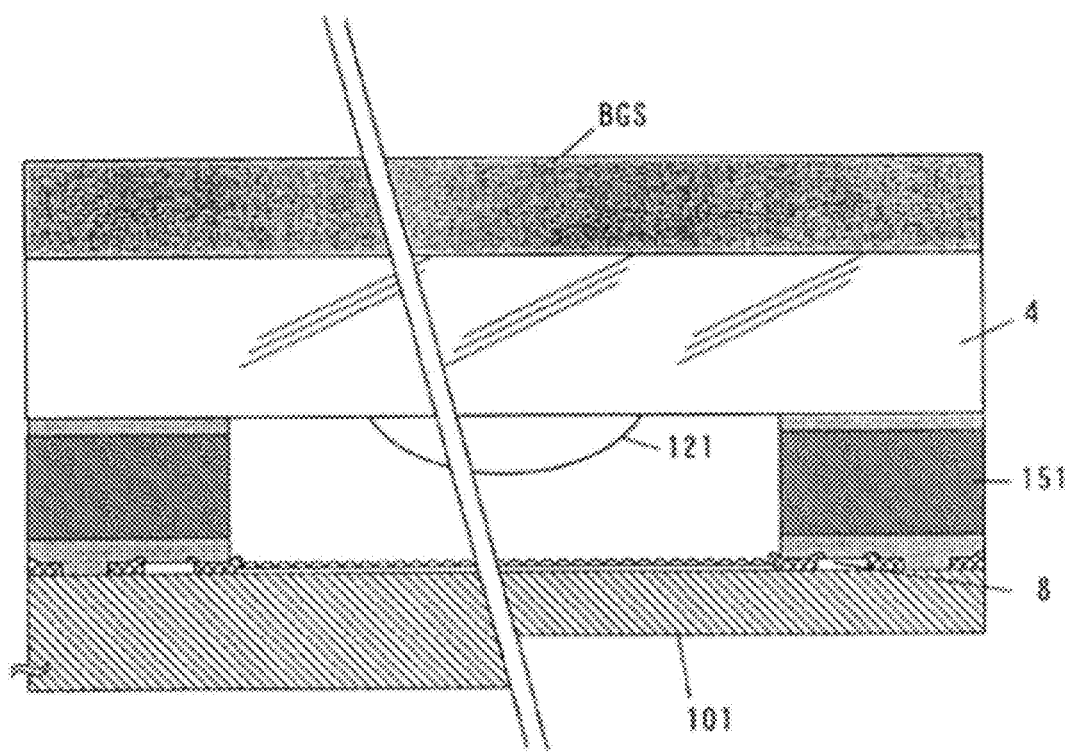
FIG. 11 is a partially enlarged schematic sectional view showing the bonded member formed of the glass wafer and the semiconductor wafer of the camera module in a grinding process according to the first embodiment of the present invention.

FIG. 11 is a partially enlarged schematic sectional view showing the bonded member formed of the glass wafer 4 and the semiconductor wafer 101 of the camera module 100 in a grinding process according to the first embodiment of the present invention.

As shown in FIG. 11, the flat surface of the glass wafer 4 is attached to a lens protection sheet such as a back-grind adhesive sheet BGS, so that the backside surface of the semiconductor wafer 101 is ground. More specifically, the semiconductor wafer 101 is ground until the semiconductor wafer 101 has a specific thickness of 50 to 100 μm, so that the second main surface of the semiconductor wafer 101 is flattened. The lens protection sheet may include a flexible sheet such as a UV sheet coated with a tacking agent removable through an ultraviolet light irradiation. The lens protection sheet may by any type of sheet as far as the sheet has solvent resistance, and is not limited thereto.

Electrode Forming Process

Figure 12:
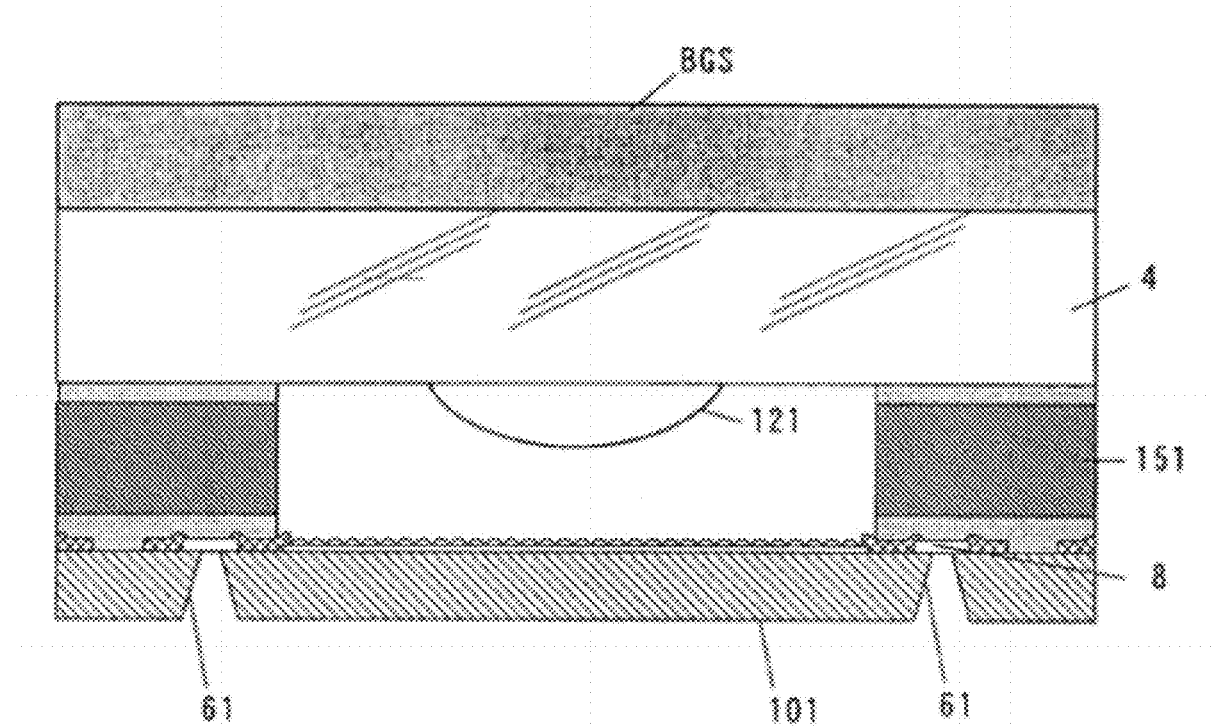
FIG. 12 is an enlarged schematic sectional view No. 1 showing the bonded member formed of the glass wafer and the semiconductor wafer of the camera module in an electrode forming process according to the first embodiment of the present invention.

FIG. 12 is an enlarged schematic sectional view No. 1 showing the bonded member formed of the glass wafer 4 and the semiconductor wafer 101 of the camera module 100 in an electrode forming process according to the first embodiment of the present invention.

In the next step, the through electrodes 6, the outer wiring portions 18, and the outer terminals 7 are formed on the second main surface of the semiconductor wafer 101 integrated with the glass wafer 4. More specifically, a through hole is formed in the semiconductor wafer 101 through deep etching. Then, a wiring portion is drawn through copper plating, and an electrode pad is formed.

As shown in FIG. 12, first, through holes 61 (having a diameter of 100 to 200 μm) are formed in the backside surface (the second main surface) of the semiconductor wafer 101, so that the through holes 61 reach the metal pads 8. More specifically, the through holes 61 having a size slightly smaller than that of the metal pads 8 are formed in the backside surface of the semiconductor wafer 101 at positions corresponding to the metal pads 8 through reactive ion etching.

In the reactive ion etching, a mask (not shown) formed of a metal or a resist is formed on the second main surface of the semiconductor wafer 101 in advance. The mask has opening portions corresponding to the through holes 61. Then, the semiconductor wafer 101 is etched through the opening portions using an $SiF_4$ formation reaction in an environment of a mixed gas such as $CF_4$, thereby forming the through holes 64.

Figure 13:
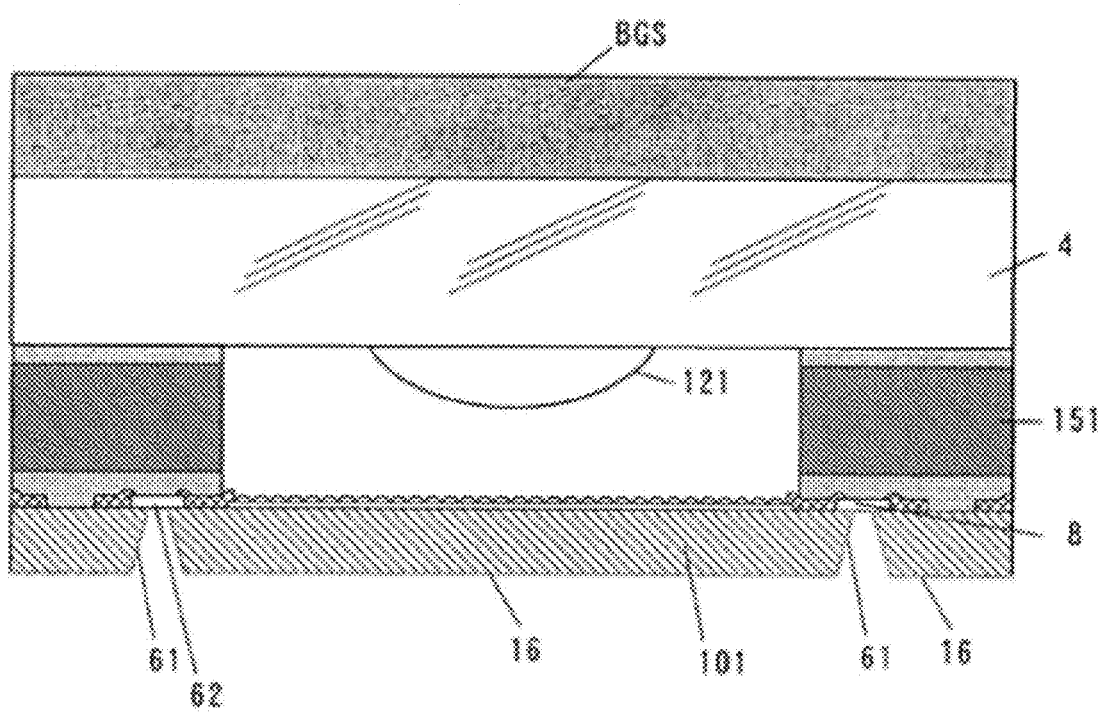
FIG. 13 is an enlarged schematic sectional view No. 2 showing the bonded member formed of the glass wafer and the semiconductor wafer of the camera module in the electrode forming process according to the first embodiment of the present invention.

FIG. 13 is an enlarged schematic sectional view No. 2 showing the bonded member formed of the glass wafer 4 and the semiconductor wafer 101 of the camera module 100 in the electrode forming process according to the first embodiment of the present invention.

In the next step, as shown in FIG. 13, the insulating film 16 is formed on the second main surface of the semiconductor wafer 101 and inner walls and bottom portion (the metal pads 8) of the through holes 61 with a CVD (Chemical Vapor Deposition) method. The insulating film 16 is formed to have a thickness on the bottom portions (the metal pads 8) of the through holes 61 smaller than that on the second main surface of the semiconductor wafer 101. Accordingly, when the reactive ion etching is performed one more time, opening portions 62 are formed in the insulating film 16 at the bottom portions of the through holes 61 to expose the metal pads 8, while the insulating film 16 remains on the inner walls of the through holes 61 and the second main surface of the semiconductor wafer 101.

Figure 14:
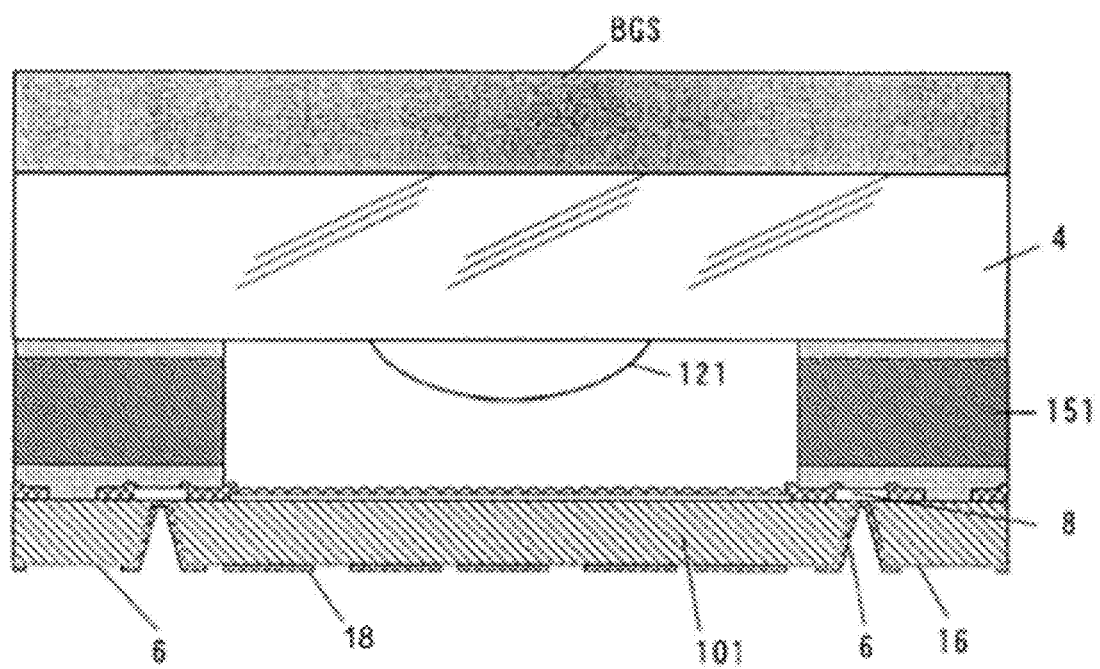
FIG. 14 is an enlarged schematic sectional view No. 3 showing the bonded member formed of the glass wafer and the semiconductor wafer of the camera module in the electrode forming process according to the first embodiment of the present invention.

FIG. 14 is an enlarged schematic sectional view No. 3 showing the bonded member formed of the glass wafer 4 and the semiconductor wafer 101 of the camera module 100 in the electrode forming process according to the first embodiment of the present invention.

In the next step, a mask (not shown) having a specific pattern is formed on the insulating film 16 on the second main surface of the semiconductor wafer 101. The mask has opening portions at positions corresponding to the through holes 61 exposing the metal pads 8, peripheral areas thereof where the through electrodes 6 are to be formed, and areas where the outer wiring portions 18 connected to the through electrodes 6 are to be formed. Then, as shown in FIG. 14, the outer wiring portions 18 and the through electrodes 6 are formed with an electro plating method.

Figure 15:
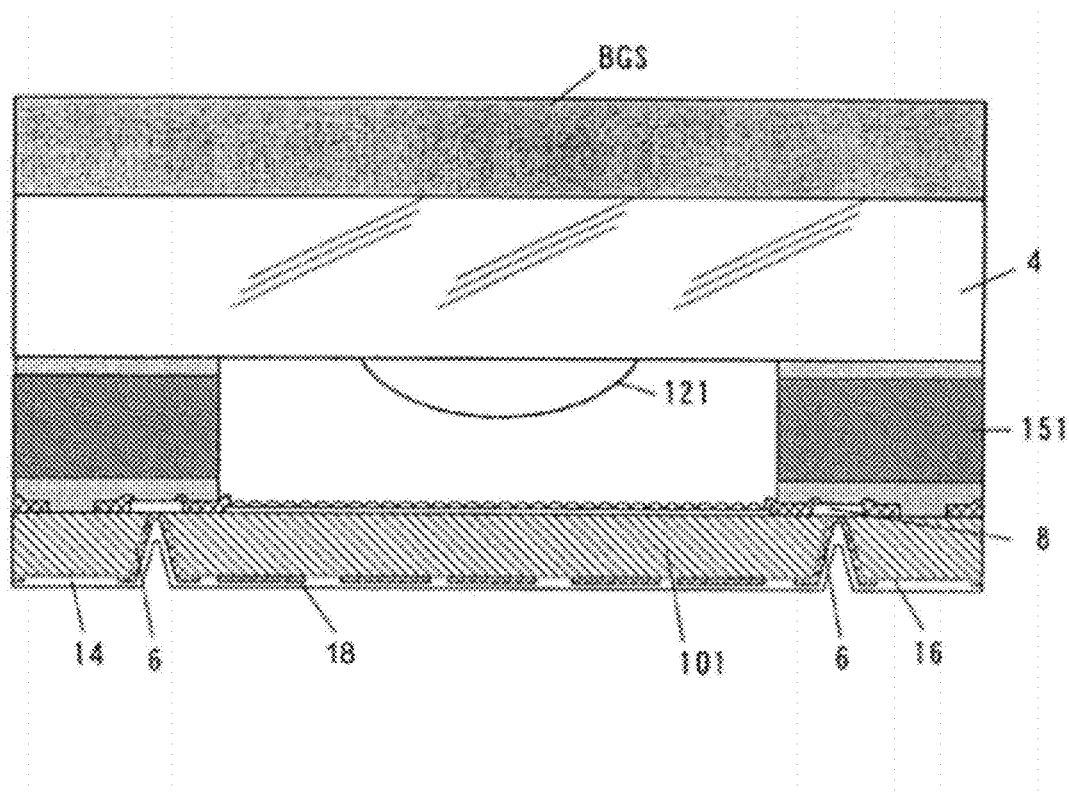
FIG. 15 is an enlarged schematic sectional view No. 4 showing the bonded member formed of the glass wafer and the semiconductor wafer of the camera module in the electrode forming process according to the first embodiment of the present invention.

FIG. 15 is an enlarged schematic sectional view No. 4 showing the bonded member formed of the glass wafer 4 and the semiconductor wafer 101 of the camera module 100 in the electrode forming process according to the first embodiment of the present invention.

In the next step, as shown in FIG. 15, the insulating film 14 is coated on an entire area of the backside surface of the semiconductor wafer 101. Then, the insulating film 14 is patterned through lithography to expose specific portions of the outer wiring portions 18 where the outer terminals 7 are to be formed for connecting to an external circuit.

Figure 16:
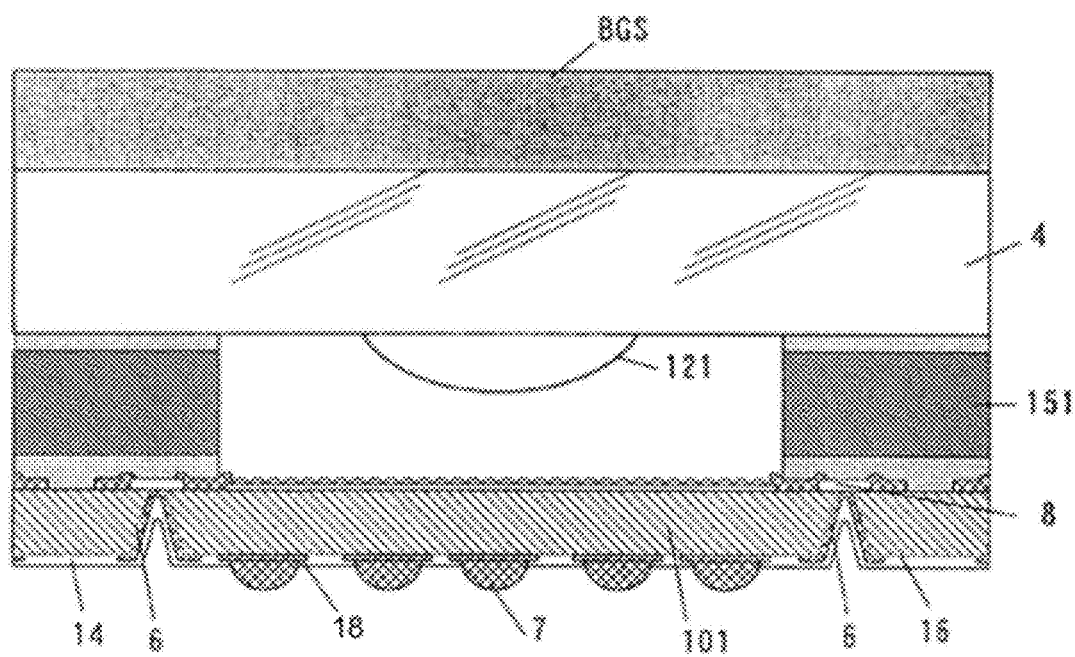
FIG. 16 is an enlarged schematic sectional view No. 5 showing the bonded member formed of the glass wafer and the semiconductor wafer of the camera module in the electrode forming process according to the first embodiment of the present invention.

FIG. 16 is an enlarged schematic sectional view No. 5 showing the bonded member formed of the glass wafer 4 and the semiconductor wafer 101 of the camera module 100 in the electrode forming process according to the first embodiment of the present invention.

In the next step, a solder paste is applied to the specific portions of the outer wiring portions 18 on the backside surface of the semiconductor wafer 101 with a screen printing method, and the reflow process is performed. Then, the solder paste remaining on the backside surface of the semiconductor wafer 101 is removed, thereby forming the outer terminals 7 as shown in FIG. 16. Before the outer terminals 7 are formed, a base metal film (not shown) may be formed.

In the embodiment, the insulating film 14 is formed of a material such as SiN and a polyimide (PI), in addition to $SiO_2$. Further, the inner wiring portions 15 and the outer wiring portions 18 are formed of a conductive material such as Cu, Al, Ag, Ni, and Au. The outer terminals 7 are formed of a material such as SnAg and NiAu.

Dicing Process

Figure 17:
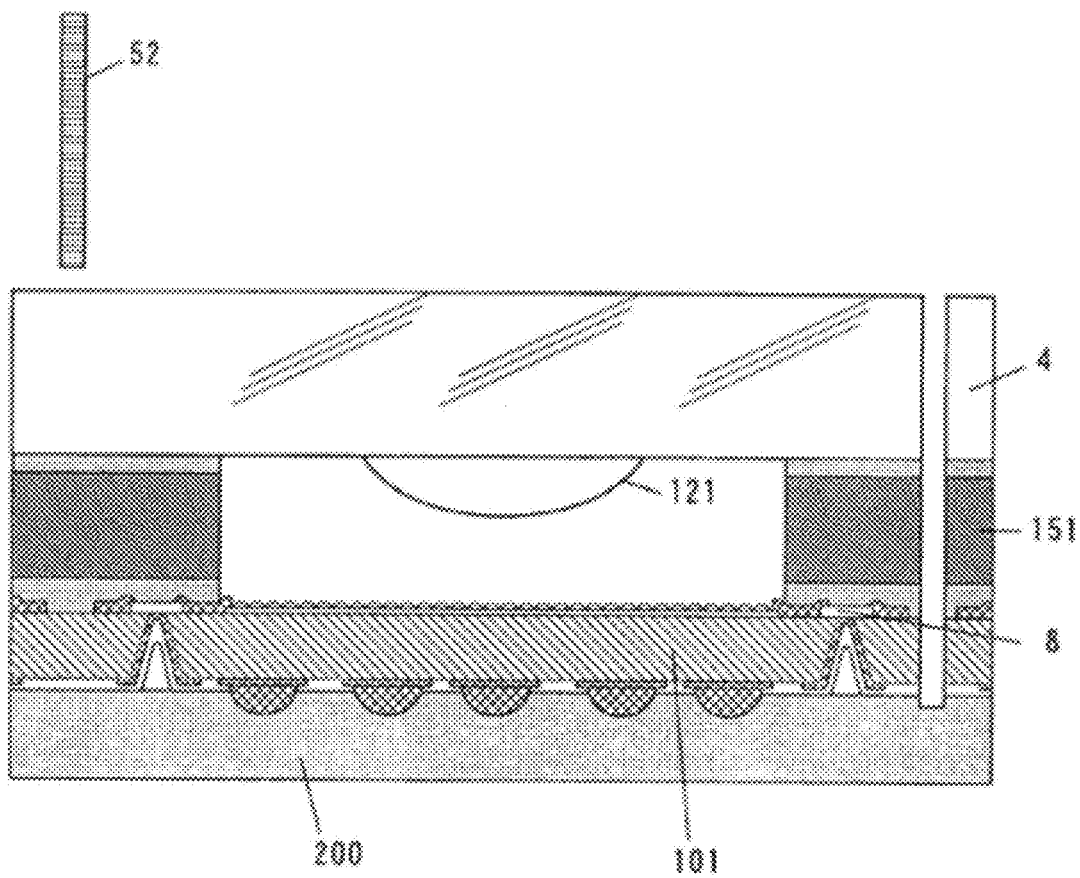
FIG. 17 is an enlarged schematic sectional view No. 1 showing the bonded member formed of the glass wafer and the semiconductor wafer of the camera module in a dicing process according to the first embodiment of the present invention.

FIG. 17 is an enlarged schematic sectional view No. 1 showing the bonded member formed of the glass wafer 4 and the semiconductor wafer 101 of the camera module 100 in a dicing process according to the first embodiment of the present invention.

In the next step, as shown in FIG. 17, the semiconductor wafer 101 integrated with the glass wafer 4 is cut with a dicing blade 52 along a center portion of the spacer portion 151 in a vertical direction, thereby separating the bonded member in pieces into the camera module 100 individually. In the dicing process, a dicing tape 200 is attached to the semiconductor wafer 101, and the bonded member formed of the glass wafer 4 and the semiconductor wafer 101 is set in a dicing device.

Figure 18:
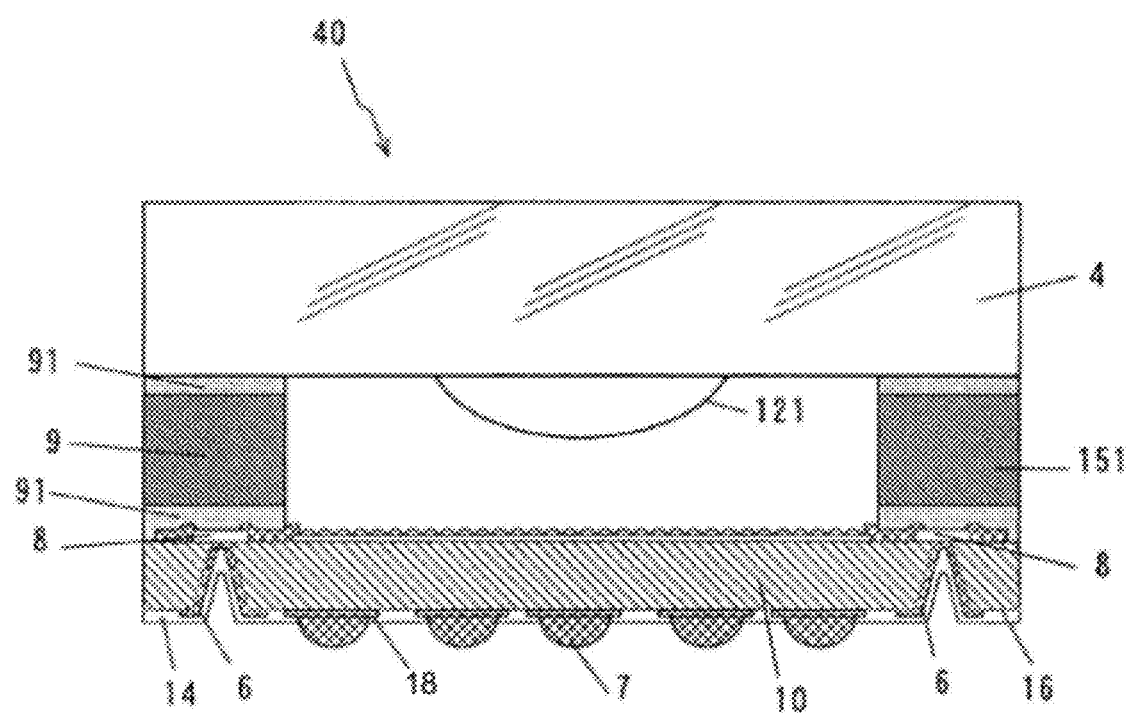
FIG. 18 is an enlarged schematic sectional view No. 2 showing the bonded member formed of the glass wafer and the semiconductor wafer of the camera module in the dicing process according to the first embodiment of the present invention.

FIG. 18 is an enlarged schematic sectional view No. 2 showing the bonded member formed of the glass wafer 4 and the semiconductor wafer 101 of the camera module 100 in the dicing process according to the first embodiment of the present invention.

As described above, the bonded member formed of the glass wafer 4 and the semiconductor wafer 101 is cut, thereby obtaining the camera module 100 having the lens chip 40, the spacer portion 151, and the sensor chip 10 as shown in FIG. 18.

Cover Coating Process

After the dicing process, the cover 5 is disposed on the camera module 100 for blocking light, and the cover 5 is fixed with an adhesive. More specifically, as shown in FIG. 1, the cover 5 formed of a black light blocking resin is disposed on the entire area of the side surfaces of the sensor chip 10, the spacer portion 151, and the lens chip 40, and the periphery portion of the lens portion 121, thereby preventing light from entering from the side surfaces and completing the camera module 100. Note that the lens chip 40 and the spacer portion 151 are cut in the dicing process to form the flat surface on the side surfaces of the sensor chip 10, the spacer portion 151, and the lens chip 40, thereby easily fixing the cover 5 with the adhesive.

As described above, in the embodiment, as oppose to a case of a convex lens portion, it is possible to attach the flat outer surface of the glass wafer 4 to the adhesive sheet over the sufficiently large area in the grinding process. Accordingly, it is possible to attach with a large adhesion force, thereby preventing the camera module 100 from cracking or being damaged.

In the embodiment, in addition to the camera module 100 having the CMOS image sensor as the sensor circuit, the method is applicable to a camera module having an image sensor circuit such as a CCD (Charge-Coupled Device) sensor circuit, a luminescence sensor circuit, an ultraviolet light sensor circuit, an infrared light sensor, and a temperature sensor.

Second Embodiment

A second embodiment of the present invention will be explained next.

In the first embodiment, the lens portion 121 is disposed on the inner surface of the glass wafer 4 or the transparent optical wafer, and faces the light receiving portion 11. The outer surface of the glass wafer 4 is the flat surface. The configuration may be referred to as a one-surface structure of a one-piece lens chip.

In the second embodiment, a camera module has a three-surface structure of a two-piece lens chip. More specifically, a second transparent optical wafer is further prepared in the glass wafer producing process. The second transparent optical wafer is disposed between the semiconductor wafer 101 and the glass wafer 4 in the bonding process. Other components in the second embodiment are similar to those in the first embodiment.

Figure 19:
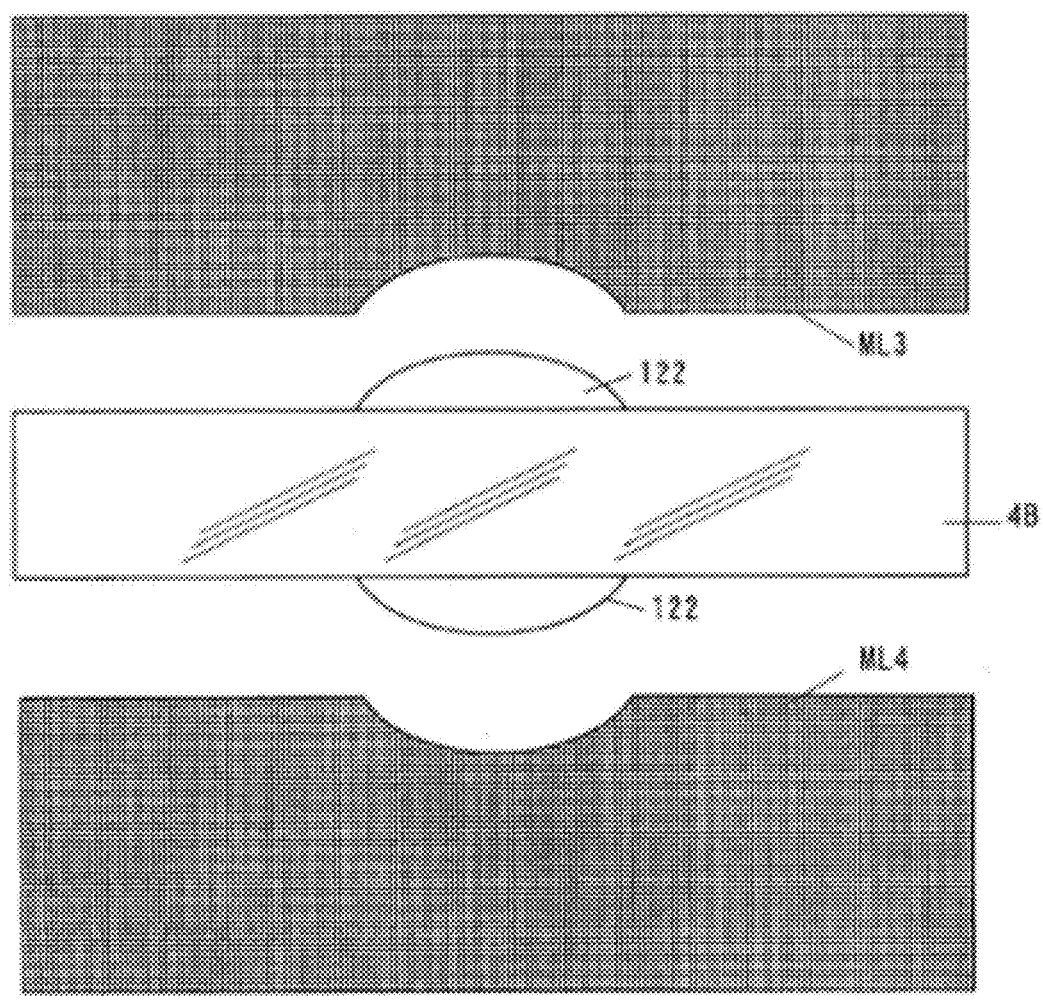
FIG. 19 is an enlarged schematic sectional view showing a glass wafer of a camera module and mold dies in a glass wafer producing process according to a second embodiment of the present invention.

FIG. 19 is an enlarged schematic sectional view showing a glass wafer 4B of a camera module and mold dies ML3 and ML4 in the glass wafer producing process according to the second embodiment of the present invention.

As shown in FIG. 19, in the glass wafer producing process, the lens transparent resin is applied both surfaces of the glass wafer 4B. Then, lens portions 122 are formed using the mold dies ML3 and ML4, thereby forming the glass wafer 4B as the second transparent optical wafer having the lens portions 122.

In the bonding process, the glass wafer 4B as the second transparent optical wafer is bonded and fixed to the semiconductor wafer 101 with a spacer portion 152 in between. Then, similar to the first embodiment, the glass wafer 4 is bonded and fixed to the glass wafer 4B with the spacer portion 151 in between.

Figure 20:
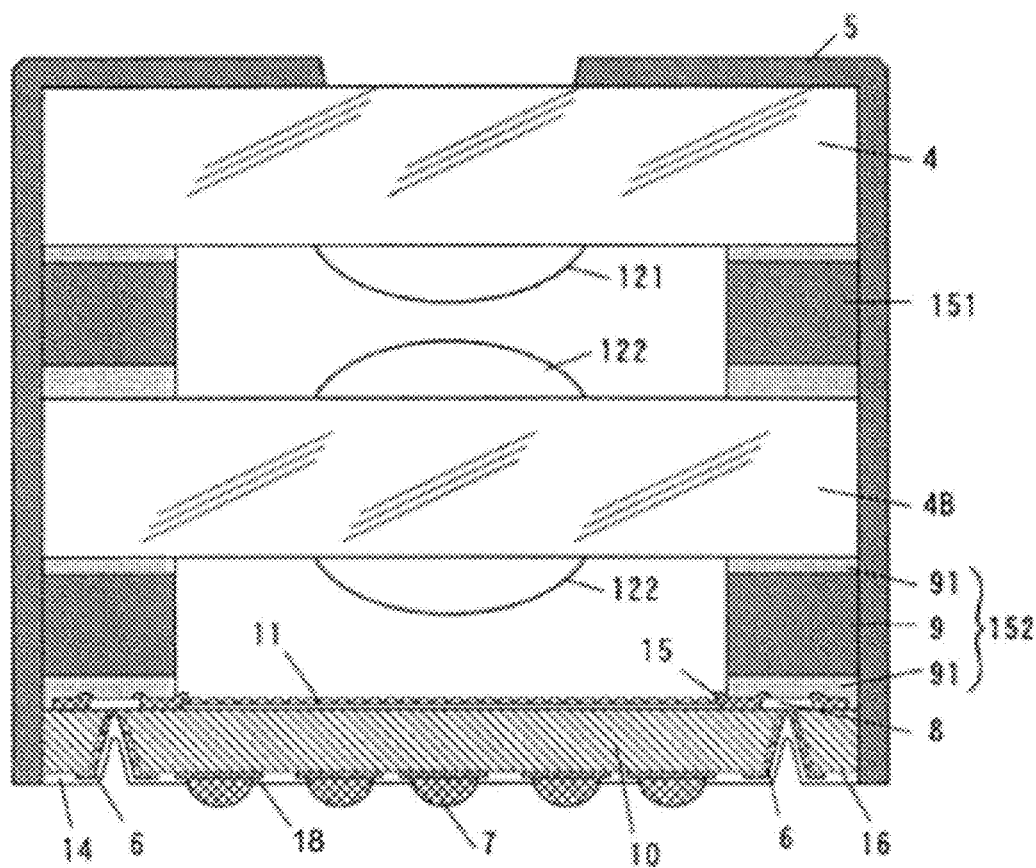
FIG. 20 is a schematic sectional view showing the camera module according to the second embodiment of the present invention.

FIG. 20 is a schematic sectional view showing the camera module according to the second embodiment of the present invention.

In the embodiment, as shown in FIG. 20, the glass wafer 4B as the second transparent optical wafer is disposed between the semiconductor wafer 101 and the glass wafer 4 with the spacer portions 151 and 152 in between. Other components in the second embodiment are similar to those in the first embodiment.

Third Embodiment

A third embodiment of the present invention will be explained next.

In the second embodiment, the camera module has the three-surface structure of the two-piece lens chip. In the third embodiment, a camera module has a five-surface structure of a three-piece lens chip. More specifically, a third transparent optical wafer is further prepared in the glass wafer producing process. The third transparent optical wafer is disposed between the semiconductor wafer 101 and the glass wafer 4B as the second transparent optical wafer in the bonding process. Other components in the third embodiment are similar to those in the first and second embodiments.

Figure 21:
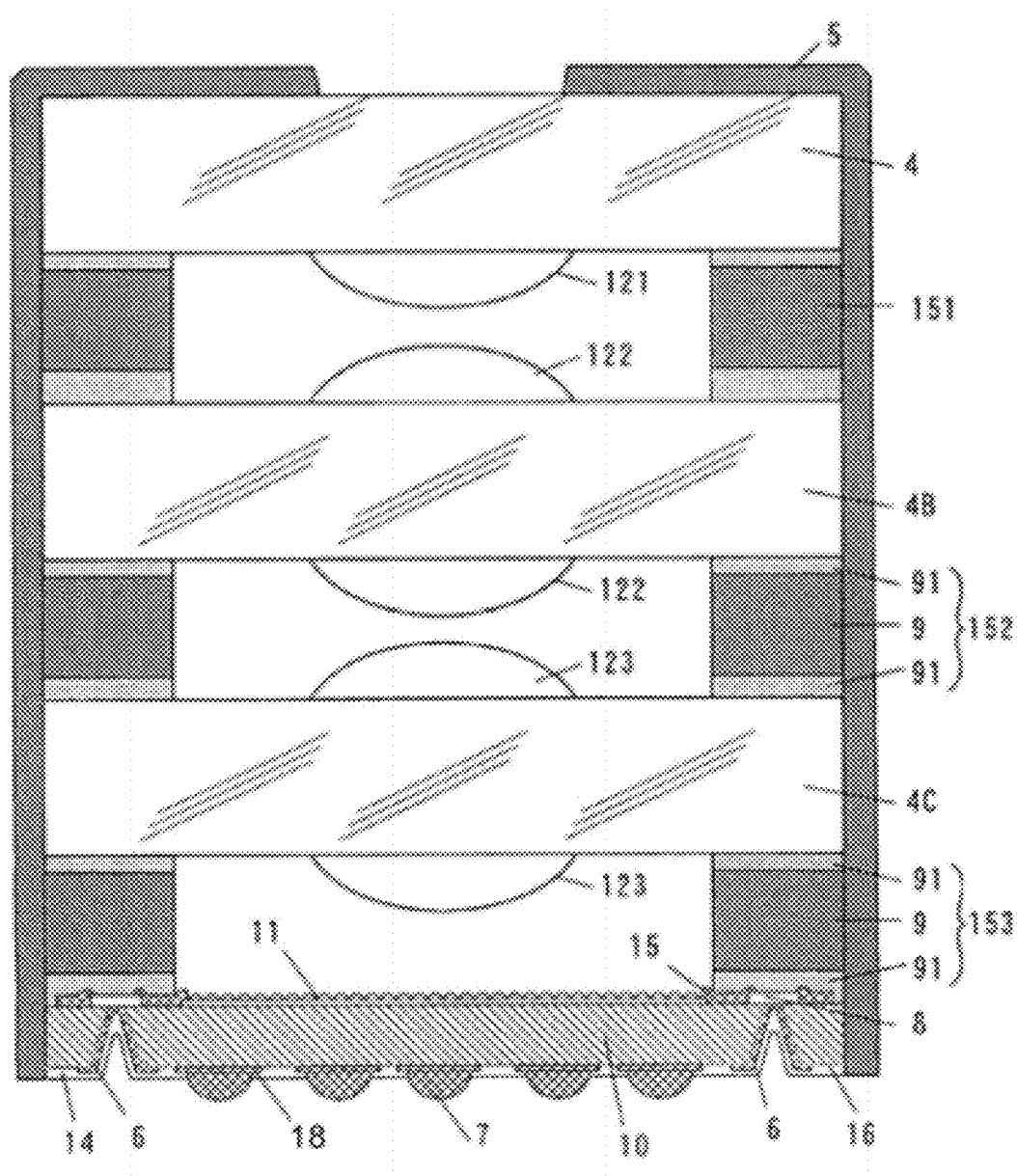
FIG. 21 is a schematic sectional view showing a camera module according to a third embodiment of the present invention.

FIG. 21 is a schematic sectional view showing the camera module according to the third embodiment of the present invention.

In the glass wafer producing process, the lens transparent resin is applied both surfaces of a glass wafer 4C. Then, lens portions 123 are formed using specific mold dies, thereby forming the glass wafer 4C as the third transparent optical wafer having the lens portions 123. Before the lens portions 123 are formed on the both surfaces of the glass wafer 4C, a functional filter such as an IR cut filter may be formed on the glass wafer 4C.

In the bonding process, the glass wafer 4C as the third transparent optical wafer is bonded and fixed to the semiconductor wafer 101 with a spacer portion 154 in between. Then, similar to the second embodiment, the glass wafer 4B as the second transparent optical wafer is bonded and fixed to the glass wafer 4C as the third transparent optical wafer with the spacer portion 152 in between. Lastly, similar to the first embodiment, the glass wafer 4 is bonded and fixed to the glass wafer 4B as the second transparent optical wafer with the spacer portion 151 in between.

In the embodiment, as shown in FIG. 21, the glass wafer 4C as the third transparent optical wafer is disposed between the semiconductor wafer 101 and the glass wafer 4B as the second transparent optical wafer with the spacer portions 152 and 153 in between. Further, the glass wafer 4B as the second transparent optical wafer is disposed between the glass wafer 4C as the third transparent optical wafer and the glass wafer 4 with the spacer portions 151 and 152 in between. Other components in the third embodiment are similar to those in the first and second embodiments. The present invention is not limited to the two-piece lens chip or the three-piece lens chip, and may be applicable to a multi-piece lens chip to obtain a similar effect.

As described above, in the embodiments, the lens portion 121 is disposed only on the inner surface of the glass wafer 4, and is not disposed on the outer surface thereof. Accordingly, when the protection sheet such as the back-grind adhesive sheet BGS is attached to the outer surface, it is possible to stably polish the backside surface of the semiconductor wafer 101. Further, the lens portion 121 does not receive an external force. Accordingly, when the backside surface of the semiconductor wafer 101 is polished, the lens portion 121 does not deform.

Further, the lens portion 121, the lens portions 122, and the lens portions 123 are situated inside the camera modules, respectively. Accordingly, after the backside surface of the semiconductor wafer 101 is polished, when the through electrodes 6 are formed, it is possible to prevent plasma or a chemical used in the electrode forming process from reaching the lens portion 121, the lens portions 122, and the lens portions 123, thereby preventing deterioration thereof. A functional filter such as an IR cut filter or an aperture may be formed on the glass wafer 4B or the glass wafer 4C.

The disclosure of Japanese Patent Application No. 2008-219647, filed on Aug. 28, 2008, is incorporated in the application by reference.

While the invention has been explained with reference to the specific embodiments of the invention, the explanation is illustrative and the invention is limited only by the appended claims.

What is claimed is:

1. A method of producing a camera module, comprising the steps of:
    preparing a semiconductor wafer having a main surface and a backside surface opposite to the main surface, said main surface including a sensor forming region and a sensor peripheral region surrounding the sensor forming region, said sensor forming region having a light receiving portion of an optical-electric conversion element disposed therein;
    preparing a lens wafer having a lens forming surface and a non-lens forming surface as a flat surface opposite to the lens forming surface, said lens forming surface including a lens forming region and a lens peripheral region surrounding the lens forming region, said lens forming region having a lens portion disposed therein;
    bonding the sensor peripheral region to the lens peripheral region through a spacer portion with a specific space in between so that the light receiving portion faces the lens portion to obtain a bonded member formed of the semiconductor wafer and the lens wafer;
    polishing the backside surface of the semiconductor wafer while the bonded member is held through the non-lens forming surface; and
    cutting the bonded member in pieces along the sensor peripheral region and the lens peripheral region to obtain the camera module formed of a sensor chip bonded to a lens chip through the spacer portion.

2. The method of producing the camera module according to claim 1, wherein, in the step of preparing the lens wafer, said lens wafer is formed of at least one transparent optical wafer.

3. The method of producing the camera module according to claim 1, further comprising the step of forming a through electrode in the semiconductor wafer, said through electrode being electrically connected to the sensor forming region, said through electrode penetrating the semiconductor wafer to reach the backside surface.

4. The method of producing the camera module according to claim 3, further comprising the step of forming an outer wiring portion so that the outer wiring portion is electrically connected to the through electrode on the backside surface.

5. The method of producing the camera module according to claim 1, further comprising the step of attaching a sheet on the non-lens forming surface for protecting the lens wafer.

6. The method of producing the camera module according to claim 1, wherein, in the step of preparing the lens wafer, said lens wafer is formed of a glass flat plate and the lens portion formed on the glass flat plate, said lens portion being formed of a resin.

7. A camera module comprising:
    a sensor chip having a main surface and a backside surface opposite to the main surface, said sensor chip having a common outer flat side surface, said main surface including a sensor forming region and a sensor peripheral region surrounding the sensor forming region, said sensor forming region having a light receiving portion of an optical-electric conversion element disposed therein;
    a lens chip having a lens forming surface and a non-lens forming surface as a flat surface opposite to the lens forming surface, said lens chip having the common outer flat side surface, said lens forming surface including a lens forming region and a lens peripheral region surrounding the lens forming region, said lens forming region having a lens portion disposed therein;

a spacer portion disposed between the sensor chip and the lens chip for bonding the sensor peripheral region to the lens peripheral region with a specific space in between so that the light receiving portion faces the lens portion, said spacer portion having the common outer flat side surface; and a cover disposed on the sensor chip, the lens chip, and the spacer portion for covering the non-lens forming surface and the common outer flat side surface, said cover including an opening portion for passing light from outside toward the lens portion and the light receiving portion.

8. The camera module according to claim 7, wherein said lens chip is formed of at least one transparent optical wafer.

9. The camera module according to claim 7, further comprising a through electrode formed in the semiconductor wafer, said through electrode being electrically connected to the sensor forming region, said through electrode penetrating the semiconductor wafer to reach the backside surface.

10. The camera module according to claim 9, further comprising an outer wiring portion so that the outer wiring portion is electrically connected to the through electrode on the backside surface.

11. The camera module according to claim 7, wherein said lens wafer is formed of a glass flat plate and the lens portion formed on the glass flat plate, said lens portion being formed of a resin.

* * * * *